United States Patent
Sekine

(10) Patent No.: US 10,554,196 B2
(45) Date of Patent: Feb. 4, 2020

(54) ACOUSTIC WAVE DEVICE

(71) Applicant: TAIYO YUDEN CO., LTD., Tokyo (JP)

(72) Inventor: Hideyuki Sekine, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 69 days.

(21) Appl. No.: 15/983,463

(22) Filed: May 18, 2018

(65) Prior Publication Data

US 2018/0358952 A1  Dec. 13, 2018

(30) Foreign Application Priority Data

Jun. 8, 2017 (JP) ................... 2017-113692

(51) Int. Cl.
| H03H 9/54  | (2006.01) |
| H03H 9/60  | (2006.01) |
| H03H 9/70  | (2006.01) |
| H03H 9/205 | (2006.01) |

(52) U.S. Cl.
CPC ............ H03H 9/706 (2013.01); H03H 9/205 (2013.01); H03H 9/54 (2013.01)

(58) Field of Classification Search
CPC ............. H03H 9/56; H03H 9/564; H03H 9/60
USPC .................................. 333/187–192
See application file for complete search history.

(56) References Cited

U.S. PATENT DOCUMENTS

| 6,842,089 B2 * | 1/2005 | Lee ..................... H03H 3/04 310/324 |
| 7,271,684 B2 * | 9/2007 | Nishihara ............ H03H 9/0095 333/133 |
| 7,498,717 B2 * | 3/2009 | Yokoyama .............. H03H 3/04 310/320 |
| 8,291,559 B2 * | 10/2012 | Heinze .................... H03H 3/04 29/25.35 |
| 2008/0055021 A1 | 3/2008 | Ueda et al. |
| 2017/0019085 A1 | 1/2017 | Kida et al. |

FOREIGN PATENT DOCUMENTS

| JP | 2008-85989 A | 4/2008 |
| JP | 2017-22667 A | 1/2017 |

* cited by examiner

*Primary Examiner* — Dean O Takaoka
(74) *Attorney, Agent, or Firm* — Chen Yoshimura LLP

(57) ABSTRACT

An acoustic wave device includes: a substrate; a first piezoelectric thin film resonator including a first resonance region in which a first lower electrode and a first upper electrode sandwich a first piezoelectric film; a second piezoelectric thin film resonator including a second resonance region in which a second lower electrode and a second upper electrode sandwich a second piezoelectric film; and a wiring layer that is located from an upper surface of the first lower electrode in a first extraction region, in which the first lower electrode is extracted from the first resonance region, to an upper surface of the second upper electrode located in a second extraction region, in which the second upper electrode is extracted from the second resonance region, and has a film thickness on the first lower electrode greater than a film thickness of the second piezoelectric film.

8 Claims, 11 Drawing Sheets

FILTER A

FILTER B

ACOUSTIC WAVE DEVICE

CROSS-REFERENCE TO RELATED APPLICATION

This application is based upon and claims the benefit of priority of the prior Japanese Patent Application No. 2017-113692, filed on Jun. 8, 2017, the entire contents of which are incorporated herein by reference.

FIELD

A certain aspect of the present invention relates to an acoustic wave device.

BACKGROUND

Acoustic wave devices including piezoelectric thin film resonators have been used as filters and duplexers of wireless devices such as, for example, mobile phones. In the piezoelectric thin film resonator, a lower electrode, a piezoelectric film, and an upper electrode are stacked on a substrate. In the acoustic wave device such as a filter, a plurality of piezoelectric thin film resonators have been used. The piezoelectric thin film resonators are interconnected by the lower electrode or the upper electrode. However, the direction of polarization (the polarity) of the piezoelectric film may affect electric characteristics, including a harmonic characteristic, of the acoustic wave device as disclosed in, for example, Japanese Patent Application Publication Nos. 2008-85989 and 2017-22667.

SUMMARY OF THE INVENTION

According to an aspect of the present invention, there is provided an acoustic wave device including: a substrate; a first piezoelectric thin film resonator including a first lower electrode located on the substrate, a first piezoelectric film located on the first lower electrode, and a first upper electrode located on the first piezoelectric film so as to form a first resonance region in which the first lower electrode and the first upper electrode sandwich at least a part of the first piezoelectric film; a second piezoelectric thin film resonator including a second lower electrode located on the substrate, a second piezoelectric film located on the second lower electrode, and a second upper electrode located on the second piezoelectric film so as to form a second resonance region in which the second lower electrode and the second upper electrode sandwich at least a part of the second piezoelectric film; and a wiring layer that is located from an upper surface of the first lower electrode in a first extraction region, in which the first lower electrode is extracted from the first resonance region, to an upper surface of the second upper electrode located on the second piezoelectric film in a second extraction region, in which the second upper electrode is extracted from the second resonance region, and has a film thickness on the first lower electrode greater than a film thickness of the second piezoelectric film.

DETAILED DESCRIPTION

The polarity of the piezoelectric thin film resonator affects the characteristics of the acoustic wave device. Thus, the characteristics may change depending on which electrode of the lower electrode and the upper electrode is connected to the node. Therefore, the lower electrode of one of the adjacent piezoelectric thin film resonators needs to be connected to the upper electrode of the other. In this case, a connection part for connecting between the lower electrode and the upper electrode is used. However, in the connection part, a wiring layer that connects the lower electrode and the upper electrode covers the level difference of the piezoelectric film. Thus, the wiring layer may be disconnected or have an increased resistance.

Hereinafter, with reference to the accompanying drawings, embodiments will be described.

First Embodiment

Description of Switching Unit

Figure 1A:
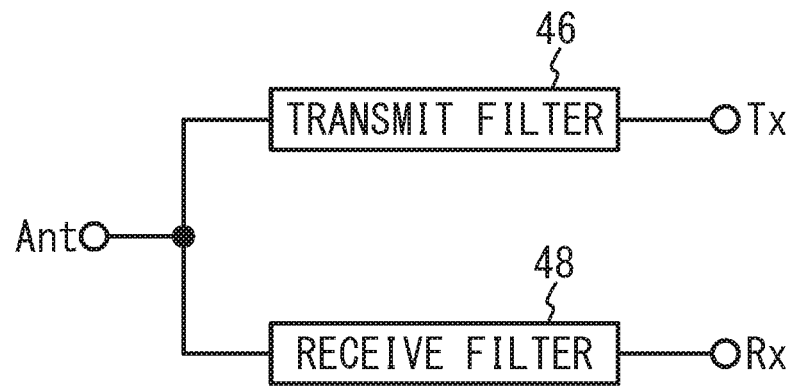
FIG. 1A is a circuit diagram of a duplexer.
Figure 1B:
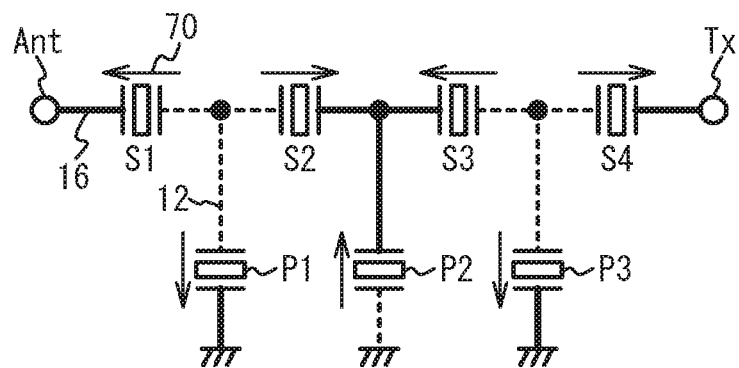
FIG. 1B and FIG. 1C are circuit diagrams of filters A and B, respectively.
Figure 1C:
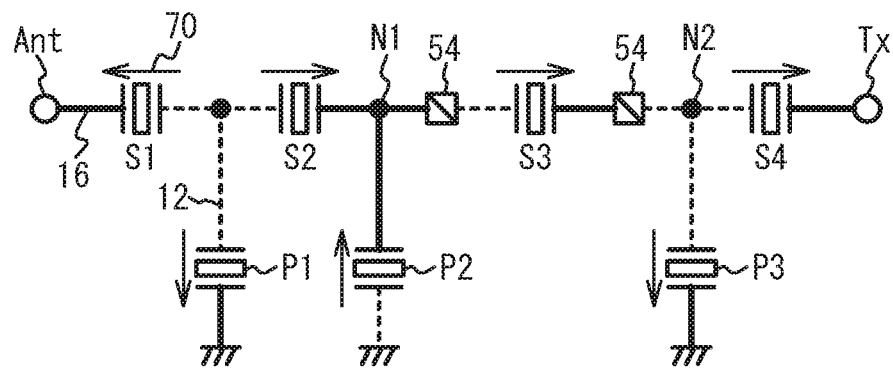

FIG. 1A is a circuit diagram of a duplexer, and FIG. 1B and FIG. 1C are circuit diagrams of filters A and B, respectively. As illustrated in FIG. 1A, a transmit filter 46 is connected between a common terminal Ant and a transmit terminal Tx. A receive filter 48 is connected between the common terminal Ant and a receive terminal Rx. The transmit filter 46 transmits signals in the transmit band to the common terminal Ant among high-frequency signals input from the transmit terminal Tx, and suppresses signals with other frequencies. The receive filter 48 transmits signals in the receive band to the receive terminal Rx among high-frequency signals input to the common terminal Ant, and suppresses signals with other frequencies.

As illustrated in FIG. 1B, in the filter A, between the common terminal Ant and the transmit terminal Tx, series resonators S1 through S4 are connected in series and parallel resonators P1 through P3 are connected in parallel. The series resonators S1 through S4 and the parallel resonators P1 through P3 are piezoelectric thin film resonators. The resonators are interconnected through a lower electrode 12 and/or an upper electrode 16 of the piezoelectric thin film resonators, and the resonator and the terminal are interconnected through the lower electrode 12 and/or the upper electrode 16 of the piezoelectric thin film resonator. The lines connected by the lower electrodes 12 are indicated by dotted lines, and the lines connected by the upper electrodes 16 are indicated by bold-solid lines. The piezoelectric film is polarized in the direction from the lower electrode 12 to the upper electrode 16. The polarity of each resonator is indicated by an arrow 70. The polarities of the series resonators S1 through S4 are alternated, and the polarities of the parallel resonators P1 through P3 are alternated.

As illustrated in FIG. 1C, in the filter B, the polarity of the series resonator S3 is opposite to that of the filter A. Thus, a connection part 54 is provided between a node N1, which is located between the series resonator S2 and the parallel resonator P2, and the series resonator S3. The connection part 54 is also provided between a node N2, which is located between the series resonator S4 and the parallel resonator P3, and the series resonator S3. This configuration enables to change the polarity of the series resonator S3 without changing the connection method in the filter unlike the filter A.

Presented are simulated second harmonic characteristics under the assumption that the filters A and B are transmit filters for the LTE band 40. Simulated was the magnitude of second harmonic from 4600 MHz to 4800 MHz output from the common terminal Ant when the high-frequency signal having an electrical power of 28 dBm and a frequency of 2300 MHz to 2400 MHz is input to the transmit terminal Tx.

Figure 2:
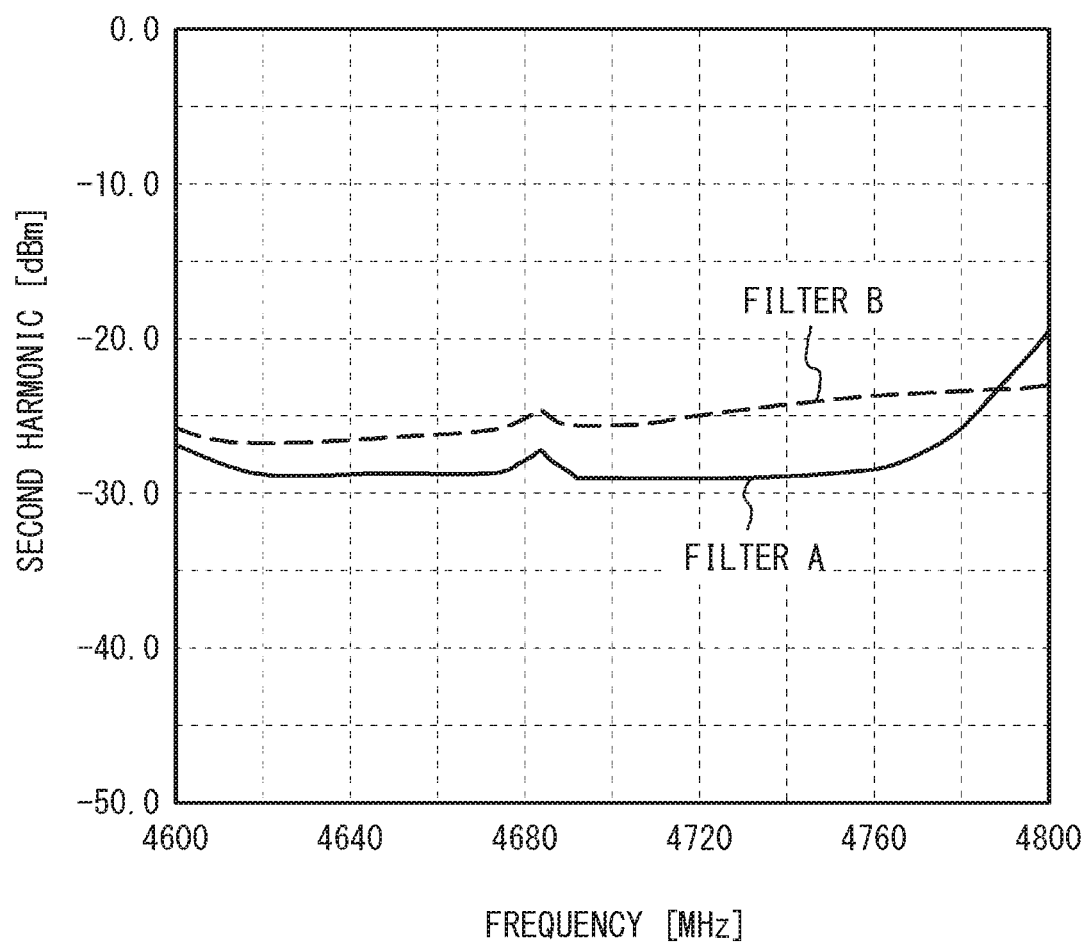
FIG. 2 illustrates the second harmonic characteristics of the filters A and B.

FIG. 2 illustrates the second harmonic characteristics of the filters A and B. As illustrated in FIG. 2, between 4600 MHz and 4800 MHz, the magnitude of the greatest second harmonic is −19.5 dBm in the filter A, and −22.5 dBm in the filter B. As described above, the second harmonic of the filter B is better than that of the filter A by approximately 3 dBm.

As described above, to improve the static dynamic characteristic such as the second harmonic characteristic and the static characteristic such as the power durability characteristic, the polarities of one or some of resonators may be changed. In this case, the connection part 54 needs to be provided.

First Comparative Example

Figure 3A:
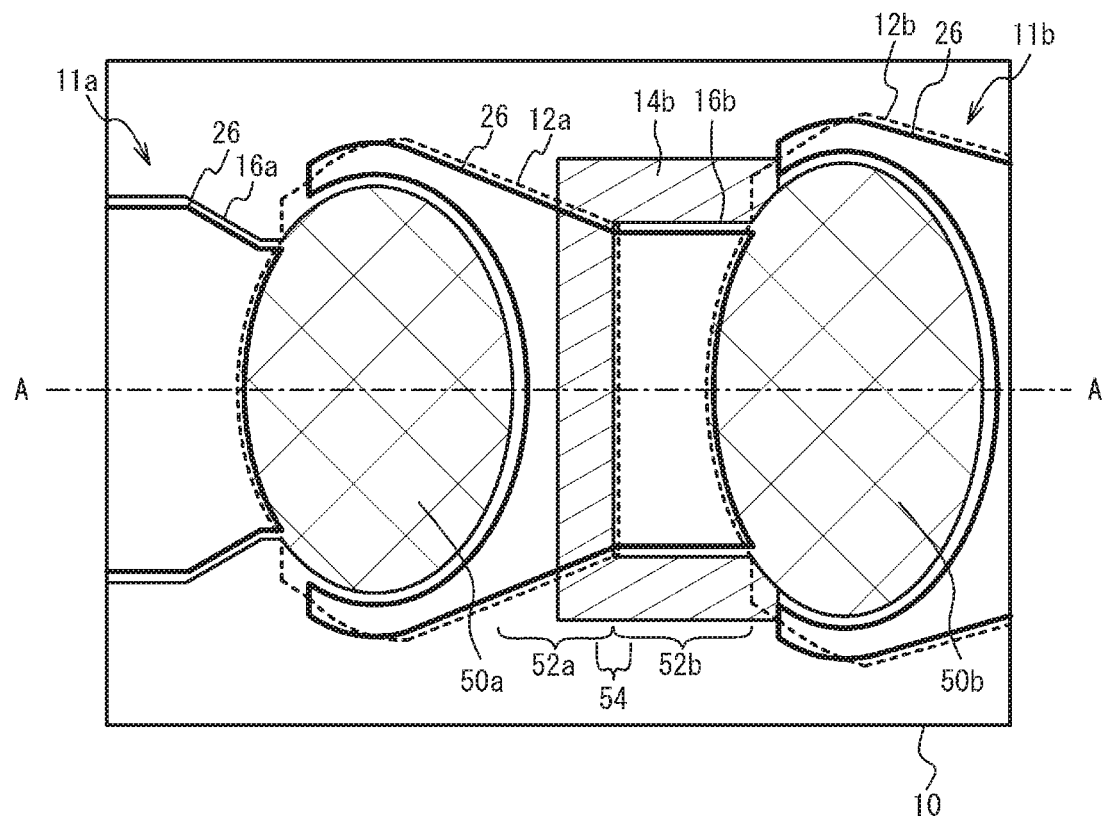
FIG. 3A is a plan view around a connection part in a first comparative example.
Figure 3B:
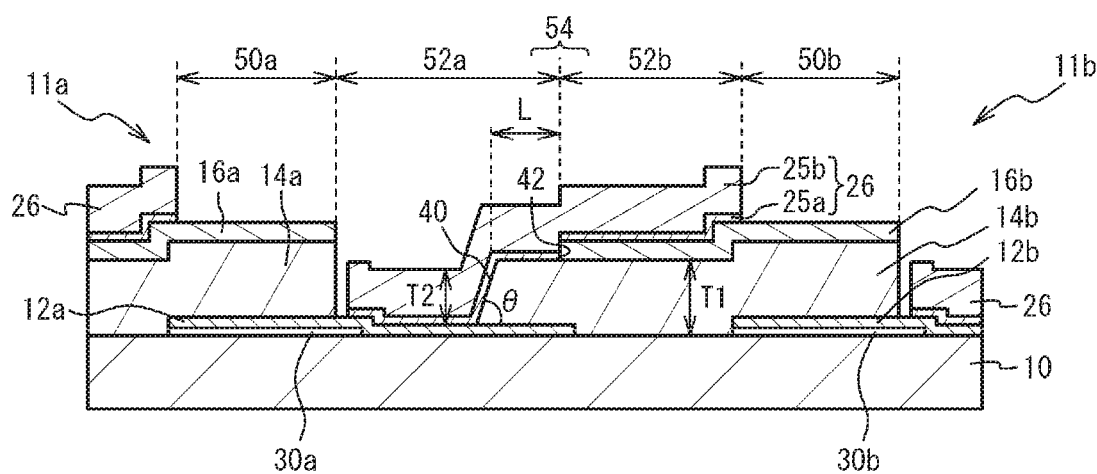
FIG. 3B is a cross-sectional view taken along line A-A in FIG. 3A.

FIG. 3A is a plan view around the connection part in a first comparative example, and FIG. 3B is a cross-sectional view taken along line A-A in FIG. 3A. For easy understanding, the scale size of FIG. 3A differs from that of FIG. 3B.

As illustrated in FIG. 3A and FIG. 3B, piezoelectric thin film resonators 11a and 11b are located on a substrate 10. The piezoelectric thin film resonator 11a includes a lower electrode 12a located on the substrate 10, a piezoelectric film 14a located on the lower electrode 12a, and an upper electrode 16a located on the piezoelectric film 14a. The piezoelectric thin film resonator 11b includes a lower electrode 12b located on the substrate 10, a piezoelectric film 14b located on the lower electrode 12b, and an upper electrode 16b located on the piezoelectric film 14b. Wiring layers 26 are located on the lower electrode 12b and the upper electrodes 16a and 16b. The wiring layers 26 function as wiring lines and pads. An air gap 30a is located between the upper surface of the substrate 10 and the lower electrode 12a, and an air gap 30b is located between the upper surface of the substrate 10 and the lower electrode 12b. The air gaps 30a and 30b are dome-shaped.

The region where the lower electrode 12a and the upper electrode 16a face each other across at least a part of the piezoelectric film 14a is a resonance region 50a, and the region where the lower electrode 12b and the upper electrode 16b face each other across at least a part of the piezoelectric film 14b is a resonance region 50b. The resonance regions 50a and 50b are regions in which the acoustic wave in the thickness extension mode excites. The resonance region 50a is included in the air gap 30a in plan view, and the resonance region 50b is included in the air gap 30b in plan view.

The region where the lower electrode 12a is extracted from the resonance region 50a is an extraction region 52a. The region where the upper electrode 16b is extracted from the resonance region 50b is an extraction region 52b. The connection part 54 is located between the extraction regions 52a and 52b.

The end faces of the piezoelectric films 14a and 14b are respectively substantially aligned with the end faces of the upper electrodes 16a and 16b. However, in the connection part 54, an end face 40 of the piezoelectric film 14b is located further out than an end face 42 of the upper electrode 16b. The distance between the end faces 40 and 42 is L. The wiring layer 26 has a lower layer 25a and an upper layer 25b located on the lower layer 25a. The film thickness T2 of the wiring layer 26 is less than the film thickness T1 of the piezoelectric film 14b. The wiring layer 26 is located so as to be in contact with the upper surface of the lower electrode 12a in the extraction region 52a, the end face 40 and the upper surface of the piezoelectric film 14b in the connection part 54, and the upper surface of the upper electrode 16b in the extraction region 52b. The wiring layer 26 enables to connect the lower electrode 12a and the upper electrode 16b between the piezoelectric thin film resonators 11a and 11b.

Fabrication Method of the First Comparative Example

Figure 4A:
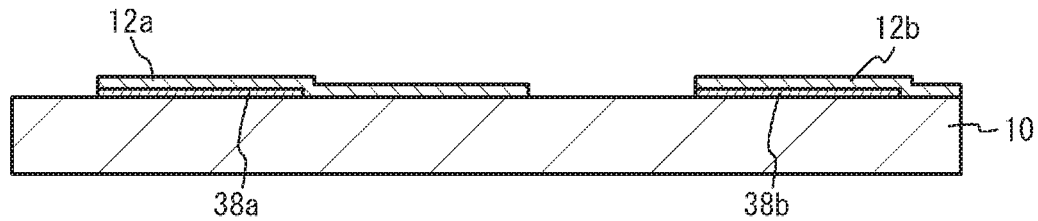
FIG. 4A through FIG. 4E are cross-sectional views illustrating a method of fabricating an acoustic wave device of the first comparative example.

FIG. 4A through FIG. 4E are cross-sectional views illustrating a method of fabricating the acoustic wave device in accordance with the first comparative example. As illustrated in FIG. 4A, sacrifice layers 38a and 38b having desired shapes are formed on the substrate 10. The sacrifice layers 38a and 38b are formed by, for example, sputtering, vacuum evaporation, or chemical vapor deposition (CVD), and then patterned by photolithography and etching. Lower electrodes 12a and 12b having desired shapes are formed on the substrate 10 so as to cover the sacrifice layers 38a and 38b, respectively. The lower electrodes 12a and 12b are formed by, for example, sputtering, vacuum evaporation, or CVD, and then patterned by photolithography and etching. The lower electrodes 12a and 12b may be formed by liftoff.

Figure 4B:
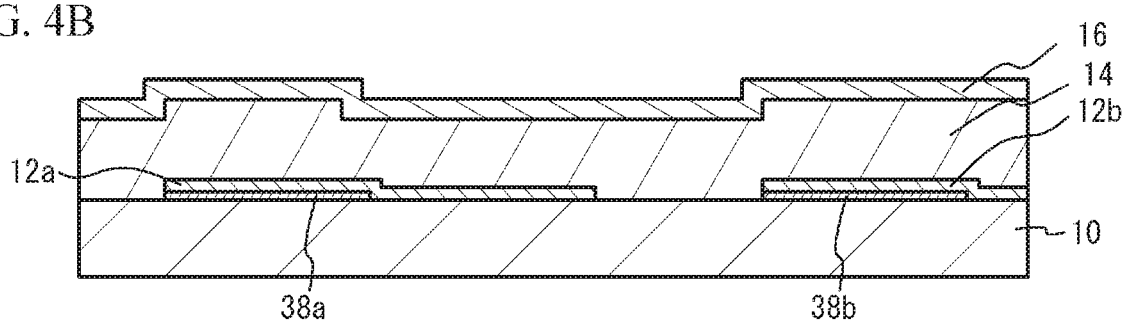
Figure 4C:
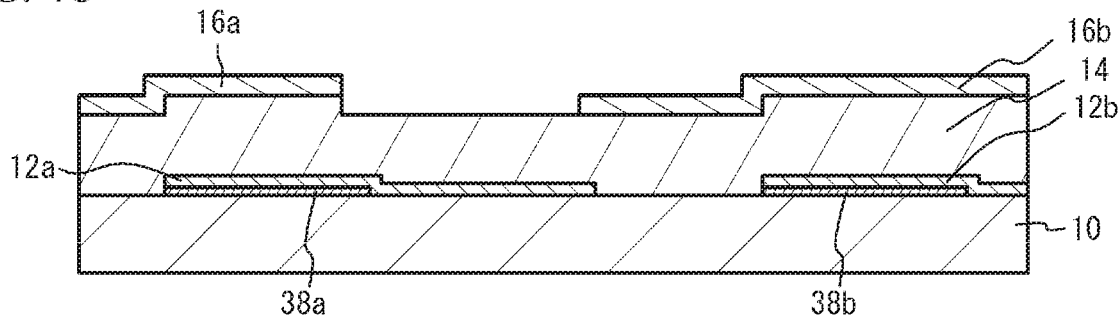

As illustrated in FIG. 4B, the piezoelectric film 14 and the upper electrode 16 are formed on the substrate 10 by, for example, sputtering, vacuum evaporation, or CVD. As illustrated in FIG. 4C, the upper electrode 16 is patterned by photolithography and etching. This process forms the upper electrodes 16a and 16b having desired shapes.

Figure 4D:
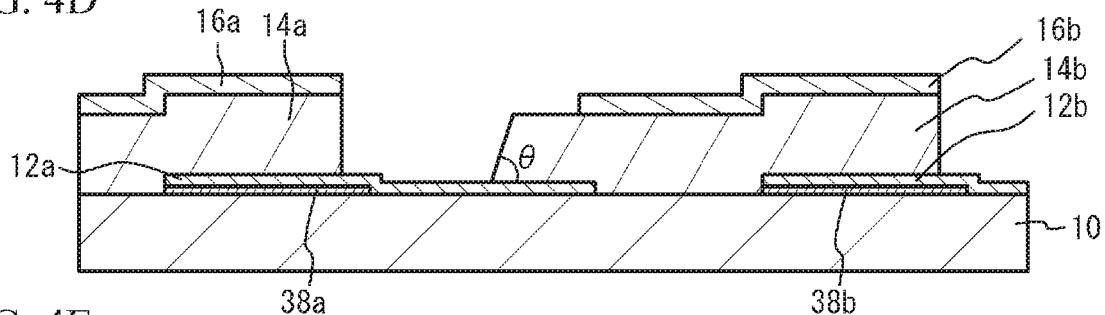

As illustrated in FIG. 4D, the piezoelectric film 14 is patterned by photolithography and etching. This process forms the piezoelectric films 14a and 14b having desired shapes. For example, when the piezoelectric film 14 is an aluminum nitride film, the piezoelectric film 14 is wet-etched by phosphoric acid-based solution. In this case, in the region where the end faces of the piezoelectric films 14a and 14b are respectively substantially aligned with the end faces of the upper electrodes 16a and 16b, the end faces of the piezoelectric films 14a and 14b are substantially perpendicular to the upper surface of the substrate 10. On the other hand, in the connection part 54, the end face of the piezoelectric film 14b is located further out than the end face of the upper electrode 16b. In such a region, the end face 40 of the piezoelectric film 14b is tilted at an angle θ to the upper surface of the substrate 10. The angle θ is, for example, 60°.

Figure 4E:
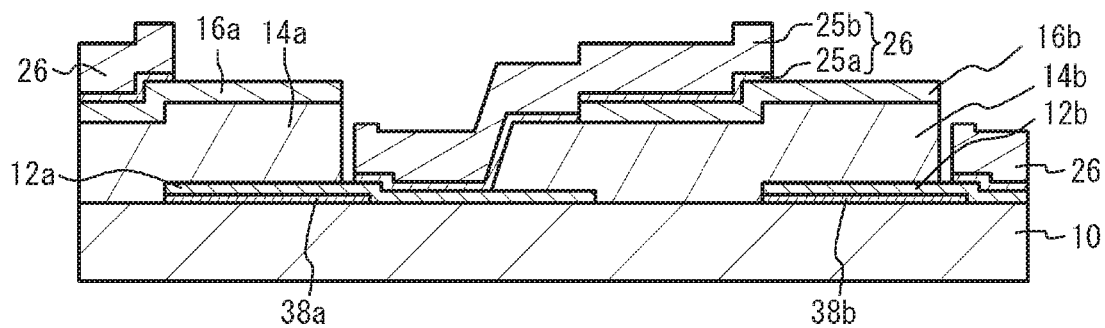

As illustrated in FIG. 4E, the wiring layer 26 is formed from the upper surface of the lower electrode 12a to the upper surface of the upper electrode 16b through the end face 40 and the upper surface of the piezoelectric film 14b. The wiring layers 26 are also formed on the lower electrode 12b and the upper electrode 16a. The wiring layers 26 are formed by, for example, vacuum evaporation and liftoff. In vacuum evaporation and liftoff, the coatability of the wiring layer 26 is not so good. However, since the end face 40 of the piezoelectric film 14b is tilted at the angle θ, the disconnection of the wiring layer 26 can be inhibited.

Thereafter, the sacrifice layers 38a and 38b are removed by etching liquid. Setting the inner stresses of the lower electrodes 12a and 12b, the piezoelectric films 14a and 14b, and the upper electrodes 16a and 16b as compression stresses causes the lower electrodes 12a and 12b to bulge out to the opposite side to the substrate 10 so as to separate from the substrate 10. The air gaps 30a and 30b having dome-shaped bulges are respectively formed between the lower electrodes 12a and 12b and the substrate 10. The above processes complete the acoustic wave device of the first comparative example.

Second Comparative Example

In the first comparative example, the distance L is several tens of micrometers, and thus the connection part 54 is large. Hence, it may be considered to make the end face of the piezoelectric film 14b substantially aligned with the end face of the upper electrode 16b in the connection part 54.

Figure 5A:
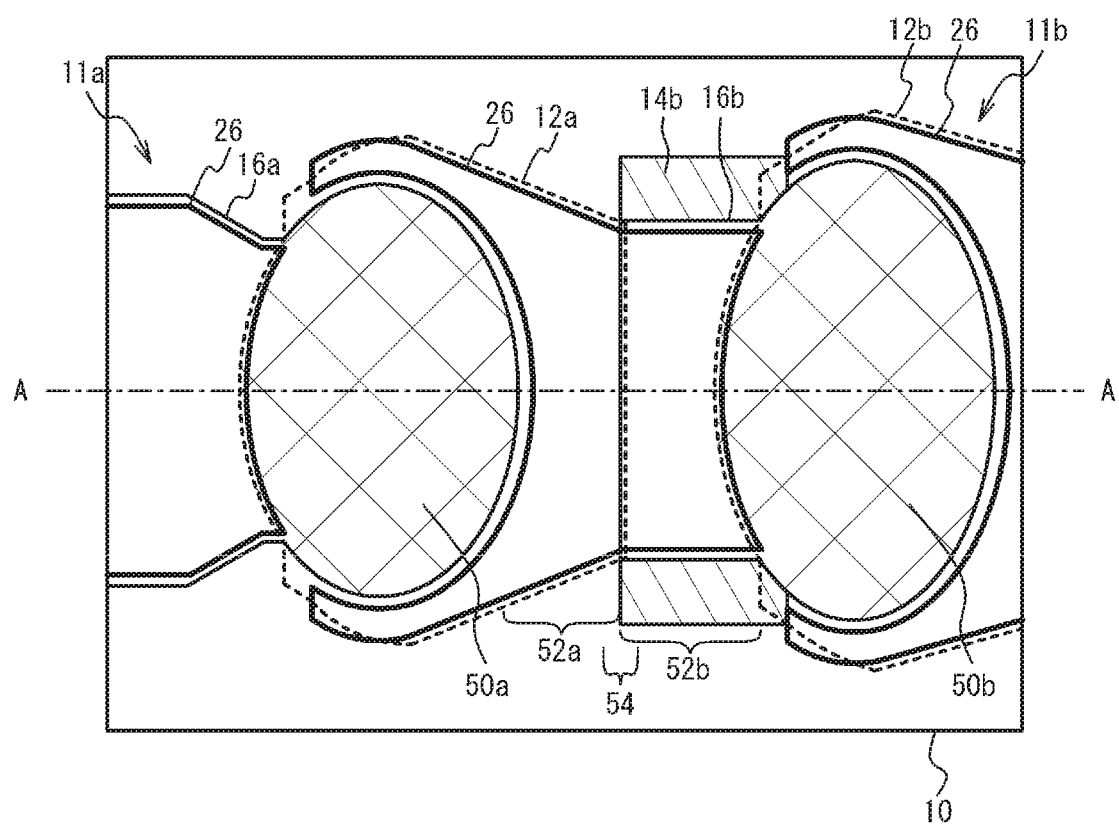
FIG. 5A is a plan view around the connection part in a second comparative example.
Figure 5B:
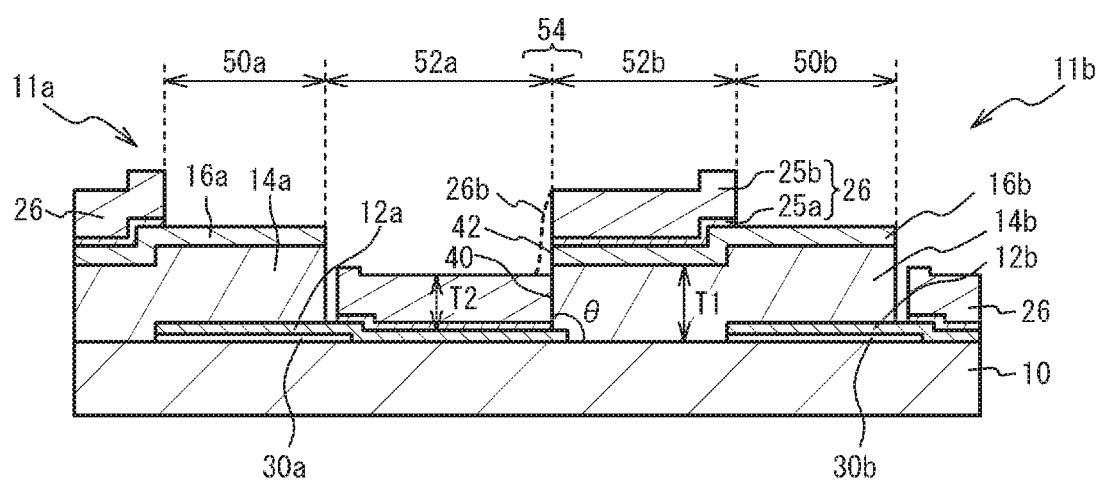
FIG. 5B is a cross-sectional view taken along line A-A in FIG. 5A.

FIG. 5A is a plan view around the connection part in a second comparative example, and FIG. 5B is a cross-sectional view taken along line A-A in FIG. 5A. As illustrated in FIG. 5A and FIG. 5B, in the second comparative example, in the connection part 54, the end face 40 of the piezoelectric film 14b is substantially aligned with the end face 42 of the upper electrode 16b. However, when the end faces 40 and 42 are aligned with each other, the angle θ between the upper surfaces of the piezoelectric film 14b and the substrate 10 is approximately 90°. Since the film thickness T2 of the wiring layer 26 is less than the film thickness T1 of the piezoelectric film 14b, the wiring layer 26 is disconnected in the connection part 54. Even when a wiring layer 26b covers the end face 40 of the piezoelectric film 14b as the wiring layer 26b indicated by the dashed line in FIG. 5B, since its film thickness is small, the wiring layer 26b has an increased resistance. When the connection part 54 is reduced in size in the manner described by the second comparative example, the wiring layer 26 is disconnected, or has an increased resistance. As described above, the wiring layer 26 deteriorates.

Switching Part of First Embodiment

Figure 6A:
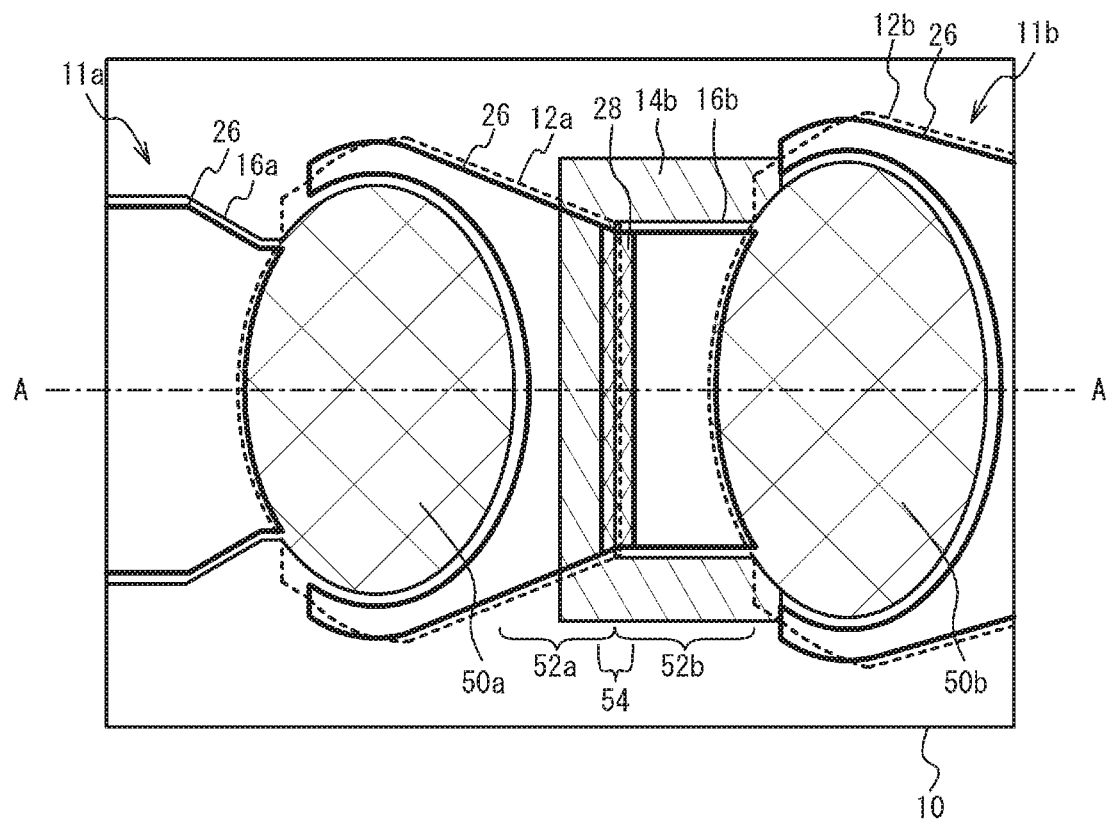
FIG. 6A is a plan view around the connection part in a first embodiment.
Figure 6B:
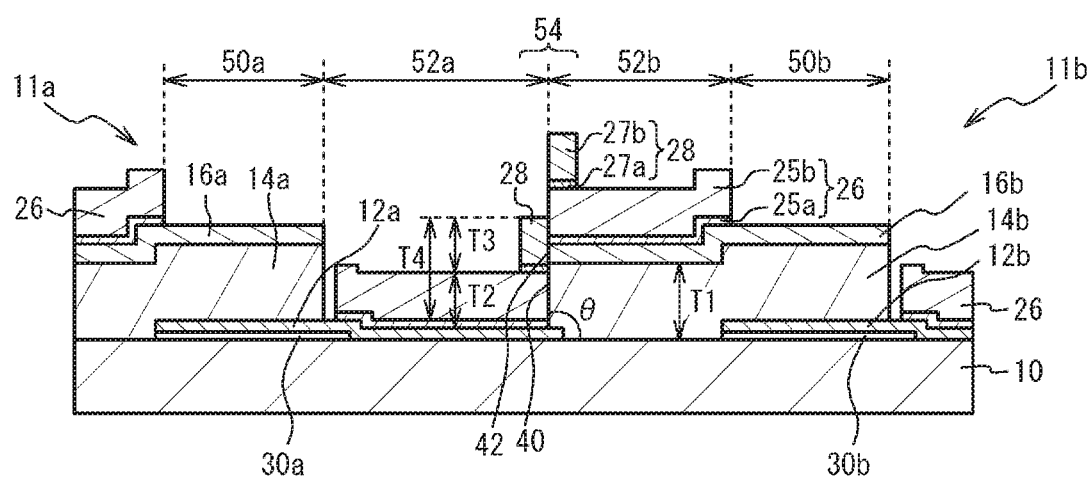
FIG. 6B is a cross-sectional view taken along line A-A in FIG. 6A.

FIG. 6A is a plan view around the connection part in a first embodiment, and FIG. 6B is a cross-sectional view taken along line A-A in FIG. 6A. As illustrated in FIG. 6A and FIG. 6B, in the first embodiment, a wiring layer 28 is located on the wiring layer 26 in the connection part 54. The total film thickness T4 of the film thickness T2 of the wiring layer 26 and the film thickness T3 of the wiring layer 28 is greater than the film thickness T1 of the piezoelectric film 14b.

Accordingly, even when the angle θ between the end face 40 of the piezoelectric film 14b and the upper surface of the substrate 10 is 90°, the end face 40 of the piezoelectric film 14b and the end face 42 of the upper electrode 16b are covered with the wiring layers 26 and 28. Additionally, since the wiring layer 26 on the lower electrode 12a and the wiring layer 26 on the upper electrode 16b are interconnected through the wiring layer 28, the deterioration, such as the disconnection or increase in resistance, of the wiring line is inhibited. Other structures are the same as those of the second comparative example, and the description thereof is thus omitted.

Figure 7A:
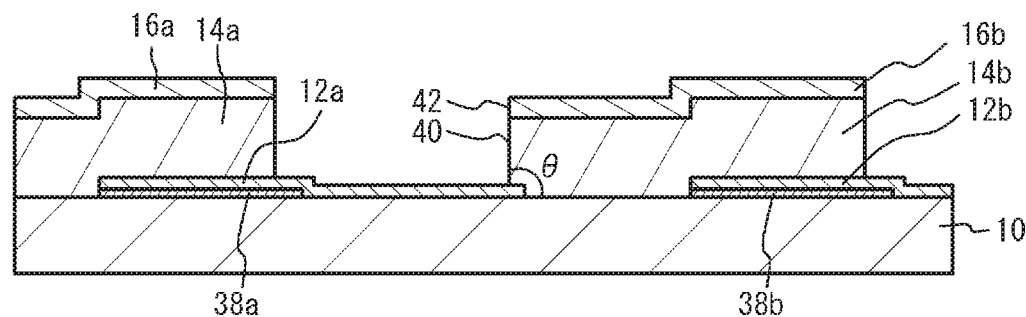
FIG. 7A through FIG. 7C are cross-sectional views (No. 1) illustrating a method of fabricating an acoustic wave device in accordance with the first embodiment.

FIG. 7A through FIG. 8B are cross-sectional views illustrating a method of fabricating an acoustic wave device of the first embodiment. As illustrated in FIG. 7A, the end face 40 of the piezoelectric film 14b and the end face 42 of the upper electrode 16b are made to be substantially aligned with each other in the connection part 54 when the piezoelectric film 14 is patterned after the processes of FIG. 4A through FIG. 4C in the first comparative example. This process makes the angle θ approximately 90°.

Figure 7B:
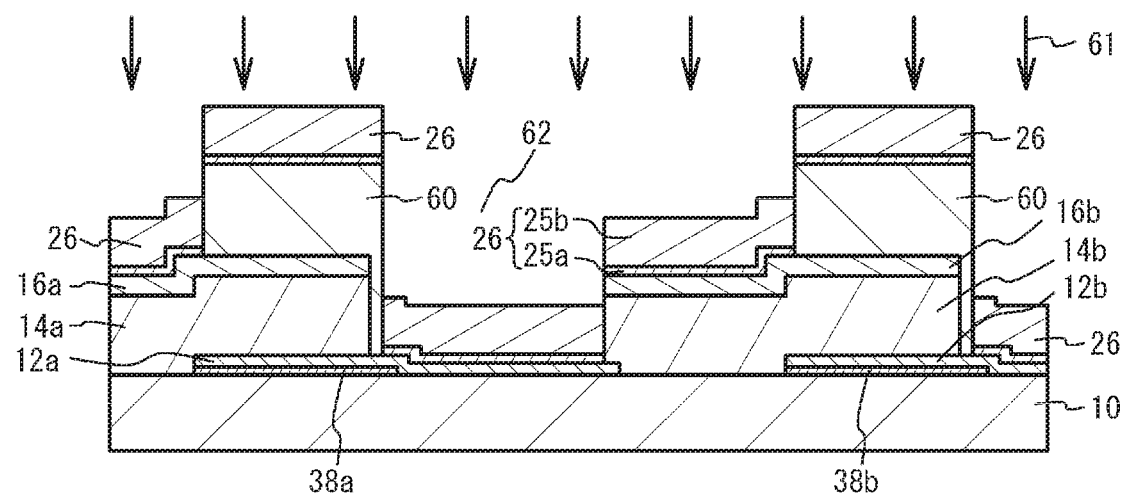

As illustrated in FIG. 7B, a mask layer 60 having an aperture 62 is formed on the lower electrodes 12a and 12b and the upper electrodes 16a and 16b. The mask layer 60 is made of, for example, photoresist, and the aperture 62 is formed by lithographic exposure and development. The wiring layer 26 is formed in the aperture 62 and on the mask layer 60 by vacuum evaporation. In this process, metal comes flying to the substrate 10 in substantially a vertical direction 61. Thus, the wiring layer 26 is not formed on the upper part of the end face 40 of the piezoelectric film 14b.

Figure 7C:
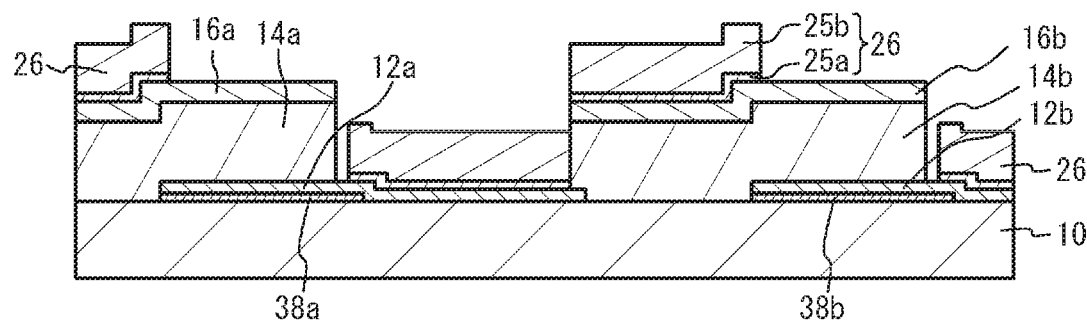

As illustrated in FIG. 7C, the mask layer 60 is removed. This process lifts-off the wiring layer 26 on the mask layer 60. The wiring layer 26 is remained on the lower electrode 12a and the upper electrode 16b inside the aperture 62.

Figure 8A:
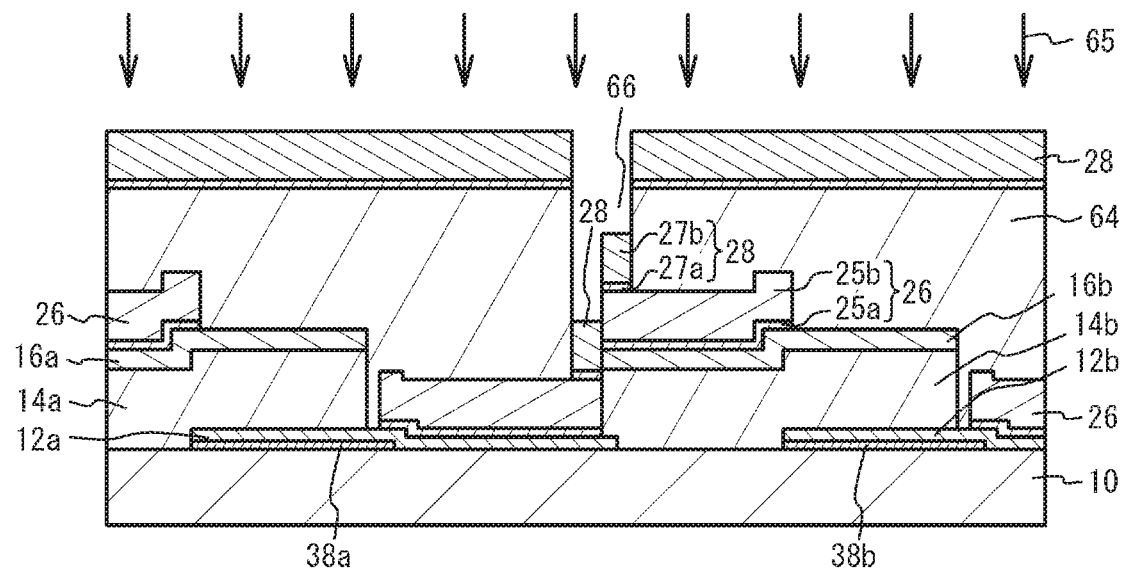
FIG. 8A and FIG. 8B are cross-sectional views (No. 2) illustrating the method of fabricating the acoustic wave device of the first embodiment.

As illustrated in FIG. 8A, a mask layer 64 having an aperture 66 is formed on the lower electrodes 12a and 12b, the upper electrodes 16a and 16b, and the wiring layer 26. The mask layer 64 is made of, for example, photoresist, and the aperture 66 is formed by lithographic exposure and development. The wiring layer 28 is formed in the aperture 66 and on the mask layer 64 by vacuum evaporation. In this process, metal comes flying to the substrate 10 in substantially a vertical direction 65.

Figure 8B:
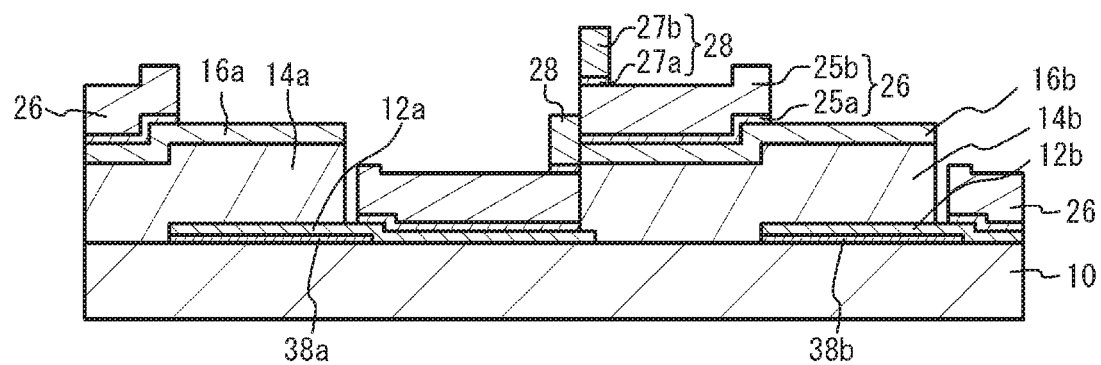

As illustrated in FIG. 8B, the mask layer 64 is removed. This process lifts-off the wiring layer 28 on the mask layer 64. The wiring layer 28 remains on the wiring layer 26 in the connection part 54. An example in which the wiring layers 26 and 28 are formed by vacuum evaporation and liftoff has been described. However, the wiring layers 26 and 28 may be formed by sputtering, vacuum evaporation, or CVD, and then patterned by photolithography and etching. Thereafter, the process of FIG. 4E in the first comparative example is executed.

The substrate 10 is, for example, a silicon (Si) substrate. The substrate 10 may be a sapphire substrate, a spinel substrate, an alumina substrate, a quartz substrate, a glass substrate, a ceramic substrate, or a GaAs substrate instead of the Si substrate. The lower electrodes 12a and 12b and the upper electrodes 16a and 16b are formed of, for example, a ruthenium (Ru) film with a film thickness of 200 nm. The lower electrodes 12a and 12b and the upper electrodes 16a and 16b may be formed of a single-layer film of chrome (Cr), aluminum (Al), titanium (Ti), copper (Cu), molybdenum (Mo), tungsten (W), tantalum (Ta), platinum (Pt), rhodium (Rh), or iridium (Jr) instead of Ru, or a multilayered film of at least two of them.

The piezoelectric films 14a and 14b are, for example, aluminum nitride films having a film thickness of 1000 nm, having the main axis in the (002) direction, and mainly composed of aluminum nitride (AlN). The piezoelectric films 14a and 14b may be made of zinc oxide (ZnO), lead zirconate titanate (PZT), or lead titanate (PbTiO$_3$) instead of aluminum nitride. Alternatively, for example, the piezoelectric film 14 may be mainly composed of aluminum nitride, and contain another element for improving the resonance characteristic or the piezoelectricity. For example, the use of scandium (Sc), a Group II or Group XII element and a Group IV element, or a Group II or Group XII element and a Group V element as additive elements improves the piezoelectricity of the piezoelectric film 14. Thus, the effective electromechanical coupling coefficient of the piezoelectric thin film resonator is improved. The Group II element is, for example, calcium (Ca), magnesium (Mg), strontium (Sr), and the Group XII element is, for example, zinc (Zn). The Group IV element is, for example, Ti, zirconium (Zr), or hafnium (Hf). The Group V element is, for example, Ta, niobium (Nb), or vanadium (V). Further alternatively, the piezoelectric film 14 may be mainly composed of aluminum nitride and contain boron (B).

The lower layer 25a and the upper layer 25b of the wiring layer 26 are formed of, for example, a Ti film with a film thickness of 100 nm and a Au film with a film thickness of 600 nm, respectively. A lower layer 27a and an upper layer 27b of the wiring layer 28 are formed of, for example, a Ti film with a film thickness of 100 nm and a Au film with a film thickness of 600 nm, respectively. The wiring layers 26 and 28 preferably contain a Au film, a Cu film, or an Al film such as the upper layers 25b and 27b to reduce the resistance. A Ti film such as the lower layers 25a and 27a is preferably contained as an adhesion film and/or a burrier film. The film thicknesses of the upper layer 25b having a less resistivity than the lower layer 25a is preferably greater than the film thicknesses of the lower layer 25a, and the film thicknesses of the upper layer 27b having a less resistivity than the lower layer 27a is preferably greater than the film thicknesses of the lower layer 27a.

Second Embodiment

Figure 9A:
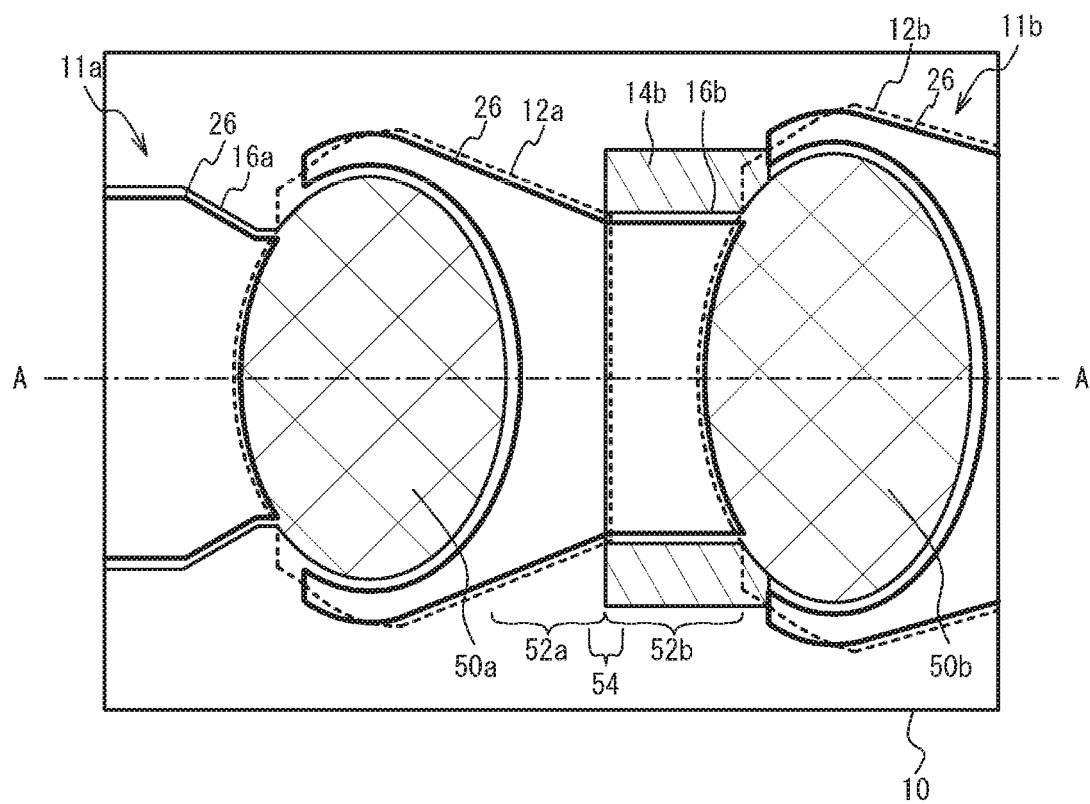
FIG. 9A is a plan view around the connection part in a second embodiment.
Figure 9B:
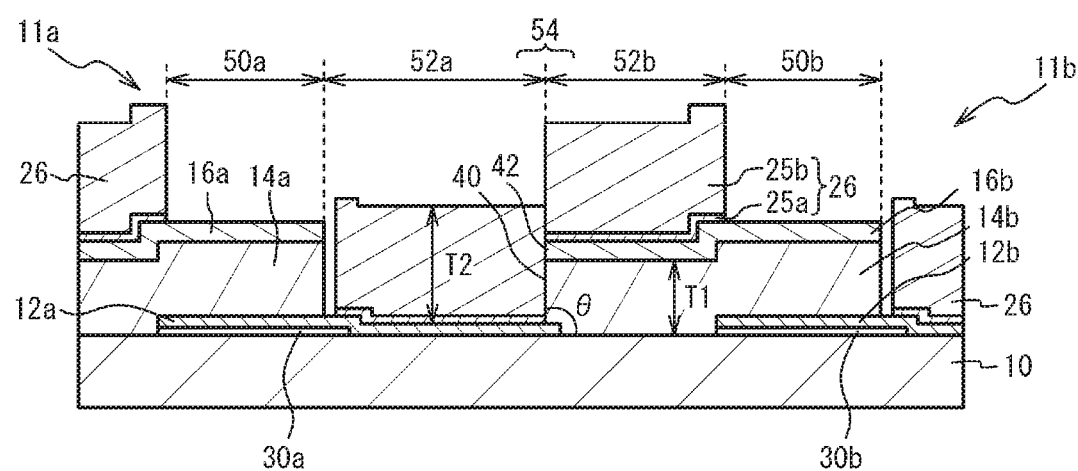
FIG. 9B is a cross-sectional view taken along line A-A in FIG. 9A.

FIG. 9A is a plan view around the connection part in a second embodiment, and FIG. 9B is a cross-sectional view taken along line A-A in FIG. 9A. As illustrated in FIG. 9A and FIG. 9B, in the second embodiment, the film thickness T2 of the wiring layer 26 is greater than the film thickness T1 of the piezoelectric film 14b. This structure makes the end face 40 of the piezoelectric film 14b and the end face 42 of the upper electrode 16b covered with the wiring layer 26 even when the angle θ between the end face 40 of the piezoelectric film 14b and the upper surface of the substrate 10 is approximately 90°. The lower layer 25a and the upper layer 25b of the wiring layer 26 are, for example, a Ti film with a film thickness of 100 nm and a Au film with a film thickness of 1000 nm, respectively. Other structures are the same as those of the first embodiment, and the description thereof is thus omitted.

Figure 10A:
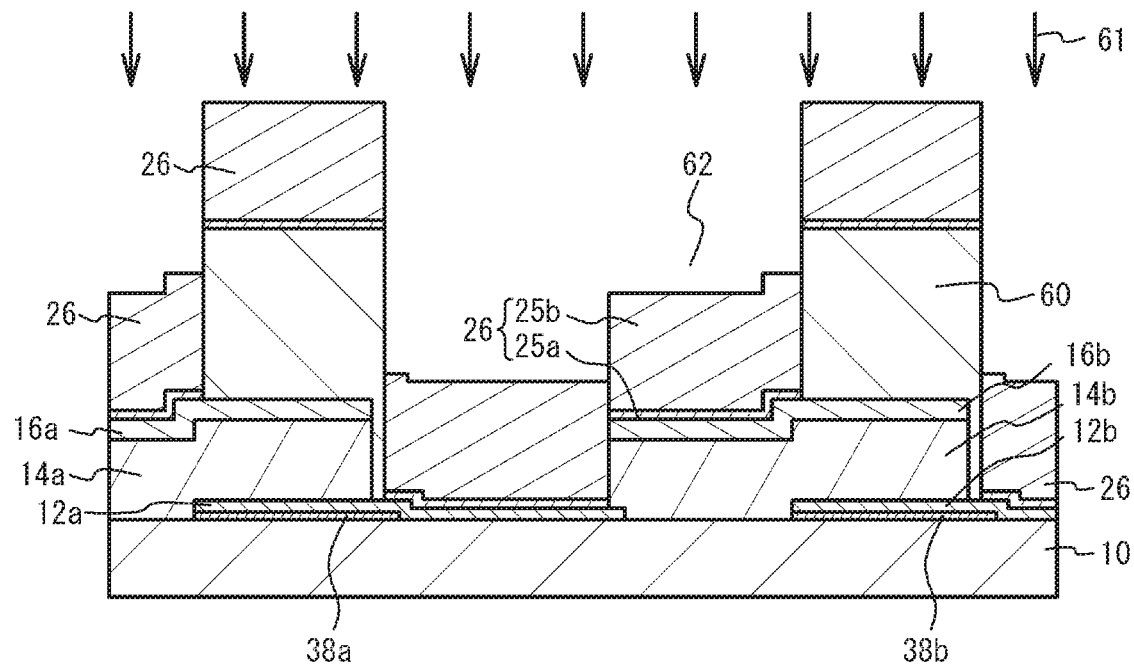
FIG. 10A and FIG. 10B are cross-sectional views illustrating a method of fabricating an acoustic wave device in accordance with the second embodiment.
Figure 10B:
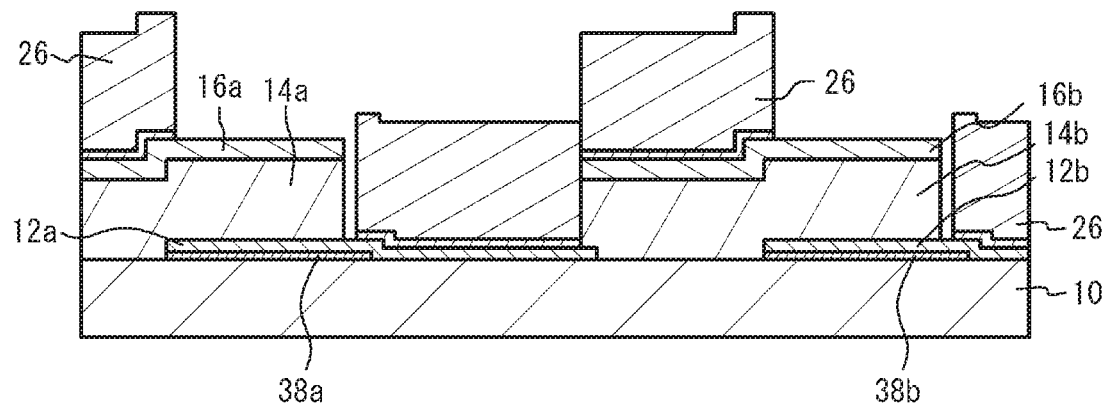

FIG. 10A and FIG. 10B are cross-sectional views illustrating a method of fabricating an acoustic wave device in accordance with the second embodiment. As illustrated in FIG. 10A, after the process of FIG. 7A in the first embodiment, as in the process of FIG. 7B, the mask layer 60 having the aperture 62 is formed on the lower electrode 12 and the upper electrode 16. The film thickness of the mask layer 60 is larger than that in FIG. 7B. The wiring layer 26 is formed in the aperture 62 and on the mask layer 60 by vacuum evaporation.

As illustrated in FIG. 10B, the mask layer 60 is removed. This process lifts-off the wiring layer 26 on the mask layer 60. The wiring layer 26 remains on the lower electrode 12a and the upper electrode 16b inside the aperture 62. The wiring layer 26 may be formed by sputtering, vacuum evaporation, or CVD, and then patterned by photolithography and etching. Thereafter, the process of FIG. 4E in the first comparative example is executed.

In the first and second embodiments, as illustrated in FIG. 6A and FIG. 6B and FIG. 9A and FIG. 9B, the piezoelectric thin film resonator 11a (a first piezoelectric thin film resonator) and the piezoelectric thin film resonator 11b (a second piezoelectric thin film resonator) are located on the substrate 10. The piezoelectric thin film resonator 11a has the lower electrode 12a (a first lower electrode), the piezoelectric film 14a (a first piezoelectric film), and the upper electrode 16a (a first upper electrode). The piezoelectric thin film resonator 11b has the lower electrode 12b (a second lower electrode), the piezoelectric film 14b (a second piezoelectric film), and the upper electrode 16b (a second upper electrode).

The extraction region 52a (a first extraction region) and the extraction region 52b (a second extraction region) are located between the resonance region 50a (a first resonance region) of the piezoelectric thin film resonator 11a and the resonance region 50b (a second resonance region) of the piezoelectric thin film resonator 11b. The wiring layers 26 and 28 of the first embodiment and the wiring layer 26 of the second embodiment are located from the upper surface of the lower electrode 12a in the extraction region 52a to the upper surface of the upper electrode 16b located on the piezoelectric film 14b in the extraction region 52b. The total film thickness T4 of the wiring layers 26 and 28 of the first embodiment and the film thickness T2 of the wiring layer 26 of the second embodiment are greater than the film thickness T1 of the piezoelectric film 14b.

This structure inhibits the wiring layers 26 and 28 of the first embodiment and the wiring layer 26 of the second embodiment from being disconnected or having an increased resistance when covering the level difference by the piezoelectric film 14b. The total film thickness T4 of the wiring layers 26 and 28 of the first embodiment and the film thickness T2 of the wiring layer 26 are more than 1.2 times, more preferably more than 1.5 times the film thickness T1 of the piezoelectric film 14b.

The wiring layers 26 and 28 of the first embodiment and the wiring layer 26 of the second embodiment cover the end face 40 of the piezoelectric film 14b in the extraction region 52b. This structure further reduces the disconnection and the increase in resistance of the wiring layer at the level difference of the piezoelectric film 14b. The wiring layers 26 and 28 of the first embodiment and the wiring layer 26 of the second embodiment may cover the end face 42 of the upper electrode 16b in addition to the end face 40.

The wiring layers 26 and 28 of the first embodiment and the wiring layer 26 of the second embodiment are in contact with the end face 40 of the piezoelectric film 14b in the extraction region 52b. This structure further reduces the disconnection and the increase in resistance of the wiring layer at the level difference of the piezoelectric film 14b. The wiring layers 26 and 28 of the first embodiment and the wiring layer 26 of the second embodiment may be in contact with the end face 42 of the upper electrode 16b in addition to the end face 40.

The position of the end face 40 of the piezoelectric film 14b is substantially aligned with the position of the end face 42 of the upper electrode 16b in the extraction region 52b. This structure makes the connection part 54 smaller than that of the first comparative example. Thus, the degree of freedom of design increases, and the acoustic wave device is reduced in size. The term "substantially aligned with each other" means "substantially aligned with each other in the range of the alignment precision of the mask, the side etching amount in the etching of the piezoelectric film 14b, and/or errors in the fabrication process.

When the angle θ between the end face 40 of the piezoelectric film 14b in the extraction region 52b and the upper surface of the substrate 10 is small, the wiring layer is easily disconnected or easily has an increased resistance. Thus, the film thickness T4 of the first embodiment and the film thickness T2 of the second embodiment are preferably greater than the film thickness T1 of the piezoelectric film 14b when the angle θ is 50° or greater, 70° or greater, or 80° or greater. The first comparative example describes a case where the wiring layer 26 is not disconnected or does not have an increased resistance when the angle θ is approximately 60°. However, even when the angle θ is 60° or less, the wiring layer 26 may be disconnected or have an increased resistance. In such a case, the film thickness T4 of the first embodiment and the film thickness T2 of the second embodiment are preferably made to be greater than the film thickness T1 of the piezoelectric film 14b.

In the first embodiment, the wiring layer 28 (a second metal layer) is located from a first part, which is located closer to the resonance region 50a than the end face 42 of the upper electrode 16b and the end face 40 of the piezoelectric film 14b, of the wiring layer 26 (a first metal layer) to a second part, which is located closer to the resonance region 50b than the end faces 40 and 42, of the wiring layer 26. As described above, the wiring layer 28 is located only in a part of the region on the wiring layer 26. This structure enables to provide no wiring layer 28 in the part where the film thickness does not need to be thick and enables to provide the wiring layer 28 in the connection part 54.

As in the second embodiment, no wiring layer 28 may be provided, and the wiring layer 26 may be thickened. This structure simplifies the fabrication process compared to the first embodiment.

When the wiring layer 26 and the wiring layer 28 are formed by vacuum evaporation and liftoff, the coatability to the end face is not good. Thus, the wiring layer 26 is easily disconnected or has an increased resistance due to the level difference of the piezoelectric film 14b. Accordingly, when the wiring layers 26 and 28 are formed by vacuum evaporation and liftoff, the film thickness T4 of the first embodiment and the film thickness T2 of the second embodiment are preferably made to be greater than the film thickness T1 of the piezoelectric film 14b.

Third Embodiment

Figure 11A:
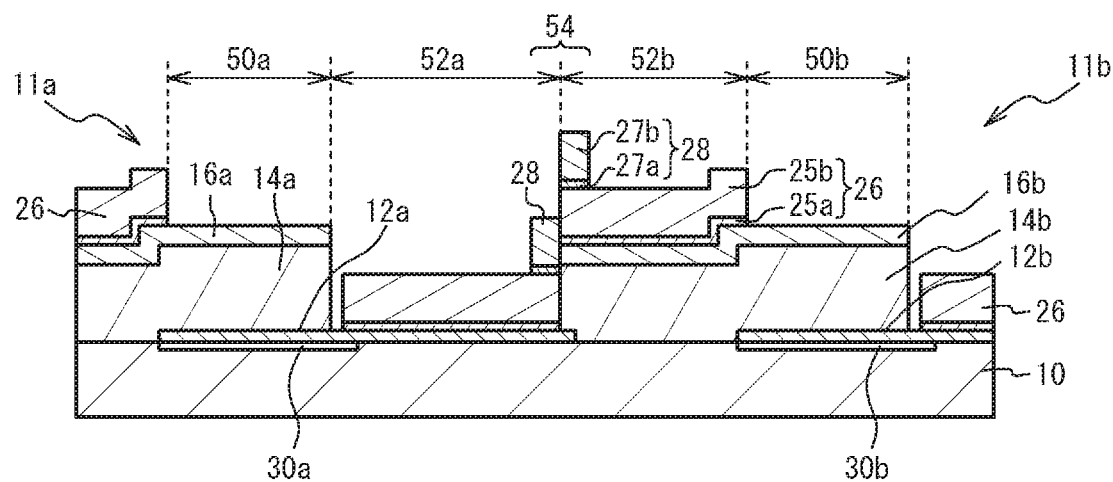
FIG. 11A is a cross-sectional view of an acoustic wave device in accordance with a third embodiment.

A third embodiment changes the structure of the air gap. FIG. 11A is a cross-sectional view of an acoustic wave device in accordance with a third embodiment. As illustrated in FIG. 11A, a recessed portion is formed on the upper surface of the substrate 10. The lower electrodes 12a and 12b are flatly formed on the substrate 10. This structure forms the air gaps 30a and 30b in the recessed portion of the substrate 10. The air gaps 30a and 30b are formed so as to include the resonance regions 50a and 50b. Other structures are the same as those of the first embodiment, and the description thereof is thus omitted. The air gaps 30a and 30b may be formed so as to penetrate through the substrate 10.

First Variation of the Third Embodiment

Figure 11B:
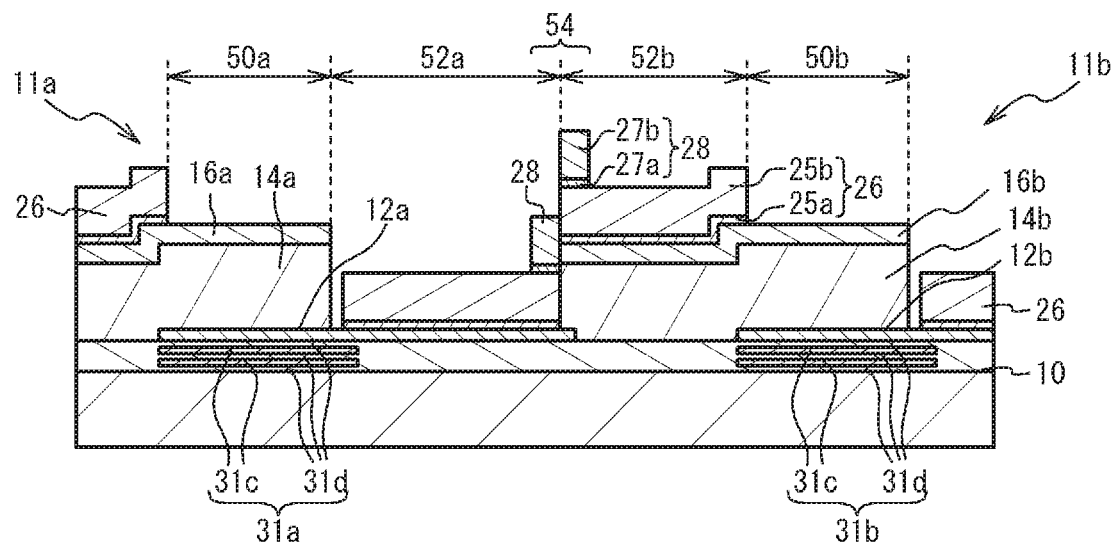
FIG. 11B is a cross-sectional view of an acoustic wave device of a first variation of the third embodiment.

FIG. 11B is a cross-sectional view of an acoustic wave device in accordance with a first variation of the third embodiment. As illustrated in FIG. 11B, acoustic mirrors 31a and 31b are respectively formed under the lower electrodes 12a and 12b in the resonance regions 50a and 50b. Each of the acoustic mirrors 31a and 31b includes films 31c with low acoustic impedance and films 31d with high acoustic impedance alternately stacked. The film thickness of each of the films 31c and 31d is, for example, λ/4 (λ, is the wavelength of the acoustic wave). The number of the films 31c and the films 31d that are stacked are freely selected. It is sufficient if each of the acoustic mirrors 31a and 31b includes two layers having different acoustic characteristics stacked at intervals. The substrate 10 may be one of the two layers having different acoustic characteristics of the acoustic mirrors 31a and 31b. For example, the acoustic mirrors 31a and 31b may have a structure in which a film having acoustic impedance different from that of the substrate 10 is located in the substrate 10. Other structures are the same as those of the first embodiment, and the description thereof is thus omitted.

In the first and second embodiments, as in the third embodiment, the air gaps 30a and 30b may be formed, or as in the first variation of the third embodiment, the acoustic mirrors 31a and 31b may be formed instead of the air gaps 30a and 30b.

As described in the first through third embodiments, the piezoelectric thin film resonators 11a and 11b may be Film Bulk Acoustic Resonators (FBARs) in which the air gaps 30a and 30b are respectively formed between the substrate 10 and the lower electrodes 12a and 12b in the resonance regions 50a and 50b. As described in the first variation of the third embodiment, the piezoelectric thin film resonators 11a and 11b may be Solidly Mounted Resonators (SMRs) having the acoustic mirrors 31a and 31b, which reflect the acoustic waves propagating through the piezoelectric films 14a and 14b, under the lower electrodes 12a and 12b in the resonance regions 50a and 50b, respectively. It is sufficient if an acoustic reflection layer includes the air gaps 30a and 30b or the acoustic mirrors 31a and 31b.

The first through third embodiments and the variations thereof describe an example in which the planar shapes of the resonance regions 50a and 50b are elliptical shapes, but may be a polygonal shape such as a quadrangle shape or a pentagonal shape.

As illustrated in FIG. 1C, the connection part 54 of the first through third embodiments and the variation thereof is used for the filter B. This structure inhibits the wiring layer in the connection part 54 of the filter B from being disconnected or having an increased resistance. In addition, the size of the filter B is reduced. The numbers of the series resonators and the parallel resonators in the filter B can be freely selected. The number of the connection parts 54 and the position of the connection part 54 can be set so that desired characteristics are achieved.

As illustrated in FIG. 1A, the filter B having the connection part 54 of the first through third embodiments and the variations thereof may be used for a duplexer. At least one of the transmit filter 46 and the receive filter 48 may be the filter B. The multiplexer may be a triplexer or a quadplexer instead of a duplexer.

Although the embodiments of the present invention have been described in detail, it is to be understood that the various change, substitutions, and alterations could be made hereto without departing from the spirit and scope of the invention.

What is claimed is:

1. An acoustic wave device comprising:
   a substrate;
   a first piezoelectric thin film resonator including
      a first lower electrode located on the substrate,
      a first piezoelectric film located on the first lower electrode, and
      a first upper electrode located on the first piezoelectric film so as to form a first resonance region in which the first lower electrode and the first upper electrode sandwich at least a part of the first piezoelectric film;
   a second piezoelectric thin film resonator including
      a second lower electrode located on the substrate,
      a second piezoelectric film located on the second lower electrode, and
      a second upper electrode located on the second piezoelectric film so as to form a second resonance region in which the second lower electrode and the second upper electrode sandwich at least a part of the second piezoelectric film; and
   a wiring layer that is located from an upper surface of the first lower electrode in a first extraction region, in which the first lower electrode is extracted from the first resonance region, to an upper surface of the second upper electrode located on the second piezoelectric film in a second extraction region, in which the second upper electrode is extracted from the second resonance region, and has a film thickness on the first lower electrode greater than a film thickness of the second piezoelectric film.

2. The acoustic wave device according to claim 1, wherein the wiring layer covers an end face of the second piezoelectric film in the second extraction region.

3. The acoustic wave device according to claim 1, wherein the wiring layer is in contact with an end face of the second piezoelectric film in the second extraction region.

4. The acoustic wave device according to claim 1, wherein a position of an end face of the second piezoelectric film is substantially aligned with a position of an end face of the second upper electrode in the second extraction region.

5. The acoustic wave device according to claim 1, wherein an angle between an end face of the second piezoelectric film in the second extraction region and an upper surface of the substrate is 50° or greater.

6. The acoustic wave device according to claim 1, wherein the wiring layer includes a first metal layer, and a second metal layer that is provided from a first part, which is closer to the first resonance region than an end face of the second piezoelectric film, of the first metal layer to a second part, which is closer to the second resonance region than the end face of the second piezoelectric film, of the first metal layer, and
a total film thickness of the first metal layer and the second metal layer on the first lower electrode is greater than the film thickness of the second piezoelectric film.

7. The acoustic wave device according to claim 1, further comprising
a filter including the first piezoelectric thin film resonator and the second piezoelectric thin film resonator.

8. The acoustic wave device according to claim 7, further comprising
a multiplexer including the filter.

* * * * *